US011063073B2

(12) United States Patent
Lee et al.

(10) Patent No.: US 11,063,073 B2
(45) Date of Patent: Jul. 13, 2021

(54) APPARATUS AND METHODS FOR CURVED FOCAL PLANE ARRAY

(71) Applicant: Massachusetts Institute of Technology, Cambridge, MA (US)

(72) Inventors: Kyusang Lee, Crozet, VA (US); Jeehwan Kim, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/487,945

(22) PCT Filed: Feb. 23, 2018

(86) PCT No.: PCT/US2018/019393
§ 371 (c)(1),
(2) Date: Aug. 22, 2019

(87) PCT Pub. No.: WO2018/156877
PCT Pub. Date: Aug. 30, 2018

(65) Prior Publication Data
US 2019/0386044 A1    Dec. 19, 2019

Related U.S. Application Data

(60) Provisional application No. 62/463,270, filed on Feb. 24, 2017.

(51) Int. Cl.
*H01L 27/146* (2006.01)
*B32B 37/26* (2006.01)
(Continued)

(52) U.S. Cl.
CPC ........ *H01L 27/14607* (2013.01); *B32B 37/26* (2013.01); *B32B 38/1866* (2013.01);
(Continued)

(58) Field of Classification Search
CPC .......... H01L 27/14607; H01L 21/6836; H01L 27/14687; H01L 27/14692;
(Continued)

(56) References Cited

U.S. PATENT DOCUMENTS 4,236,947 A * 12/1980 Baliga ................. C30B 19/02
                                                    117/56
4,727,047 A    2/1988 Bozler et al.
(Continued)

FOREIGN PATENT DOCUMENTS

JP   2011-009268 A   1/2011
JP   2014-237570 A   12/2014
(Continued)

OTHER PUBLICATIONS

Adams et al., Demonstration of multiple substrate reuses for inverted metamorphic solar cells. IEEE J Photovolt. 2013;3(2):899-903. 6 pages.
(Continued)

*Primary Examiner* — Shahed Ahmed
(74) *Attorney, Agent, or Firm* — Wolf, Greenfield & Sacks, P.C.

(57) ABSTRACT

A method of fabricating a curved focal plane array (FPA) includes forming an epitaxial layer including a semiconductor on a release layer. The release layer includes a two-dimensional (2D) material and is disposed on a first substrate. The method also includes forming a metal layer on the epitaxial layer and transferring the epitaxial layer and the metal layer to a second substrate including an elastomer. The method also includes fabricating a plurality of photodetectors from the epitaxial layer and bending the second substrate to form the curved FPA.

24 Claims, 7 Drawing Sheets

(51) Int. Cl.
*B32B 38/18* (2006.01)
*H01L 21/683* (2006.01)
*H01L 31/0224* (2006.01)
*H01L 31/18* (2006.01)

(52) U.S. Cl.
CPC .... *H01L 21/6836* (2013.01); *H01L 27/14643* (2013.01); *H01L 27/14687* (2013.01); *H01L 27/14692* (2013.01); *H01L 27/14694* (2013.01); *H01L 31/022408* (2013.01); *H01L 31/1804* (2013.01); *H01L 31/184* (2013.01); *H01L 31/1896* (2013.01); *B32B 2457/00* (2013.01); *H01L 2221/68368* (2013.01); *H01L 2221/68381* (2013.01)

(58) Field of Classification Search
CPC ....... H01L 27/14694; H01L 31/022408; H01L 31/1804; H01L 31/184; H01L 31/1896; H01L 2221/68368; H01L 2221/68381; H01L 2924/12043; H01L 31/186–208; H01L 31/02322; H01L 27/14643–14663; B32B 37/26; B32B 38/1866; B32B 2457/00
See application file for complete search history.

(56) References Cited

U.S. PATENT DOCUMENTS

| | | | |
|---|---|---|---|
| 5,114,745 | A | 5/1992 | Jones |
| 5,308,661 | A | 5/1994 | Feng et al. |
| 5,349,922 | A | 9/1994 | Anthony et al. |
| 5,527,559 | A | 6/1996 | Simpson |
| 5,641,381 | A | 6/1997 | Bailey et al. |
| 5,792,254 | A | 8/1998 | Windischmann |
| 6,566,256 | B1* | 5/2003 | Solomon ............ H01L 21/0237 257/E21.108 |
| 8,906,772 | B2 | 12/2014 | Sumant |
| 8,916,451 | B2 | 12/2014 | Bayram et al. |
| 9,096,050 | B2 | 8/2015 | Bedell et al. |
| 9,991,113 | B2 | 6/2018 | Kim et al. |
| 10,770,289 | B2 | 9/2020 | Kim |
| 2005/0109918 | A1 | 5/2005 | Nikzad et al. |
| 2006/0021565 | A1 | 2/2006 | Zahler et al. |
| 2009/0045395 | A1 | 2/2009 | Kim et al. |
| 2009/0162549 | A1 | 6/2009 | Fryda et al. |
| 2010/0224950 | A1* | 9/2010 | Dinyari ............ B81B 7/04 257/441 |
| 2011/0244662 | A1 | 10/2011 | Lee et al. |
| 2011/0294281 | A1 | 12/2011 | Zang et al. |
| 2012/0141799 | A1 | 6/2012 | Kub et al. |
| 2012/0238083 | A1 | 9/2012 | Pan |
| 2013/0001731 | A1 | 1/2013 | Forrest et al. |
| 2013/0001748 | A1* | 1/2013 | Faurie ............ H01L 21/02389 257/615 |
| 2013/0143397 | A1 | 6/2013 | Fuller et al. |
| 2013/0285016 | A1 | 10/2013 | Wei et al. |
| 2013/0288458 | A1 | 10/2013 | Wei et al. |
| 2013/0316488 | A1* | 11/2013 | Bedell ............ H01L 31/0684 438/68 |
| 2014/0001152 | A1 | 1/2014 | Zurutuza Elorza et al. |
| 2014/0220764 | A1 | 8/2014 | Bayram et al. |
| 2014/0342127 | A1* | 11/2014 | Dimitrakopoulos .... B32B 9/041 428/172 |
| 2015/0084074 | A1 | 3/2015 | Bayram et al. |
| 2015/0122659 | A1* | 5/2015 | Kula ............ C23C 16/003 205/88 |
| 2015/0171234 | A1* | 6/2015 | Ushinsky ............ G02B 5/208 257/432 |
| 2015/0179968 | A1 | 6/2015 | Forrest et al. |
| 2016/0064489 | A1 | 3/2016 | Zhang et al. |
| 2016/0268128 | A1 | 9/2016 | Cheng et al. |
| 2016/0329457 | A1* | 11/2016 | Forrest ............ H01L 31/0687 |
| 2016/0333472 | A1 | 11/2016 | Xu et al. |
| 2016/0351747 | A1 | 12/2016 | Forrest et al. |
| 2017/0018614 | A1 | 1/2017 | Rupp et al. |
| 2017/0352538 | A1 | 12/2017 | Kim et al. |
| 2018/0114803 | A1* | 4/2018 | Forrest ............ H01L 27/14687 |

FOREIGN PATENT DOCUMENTS

| | | |
|---|---|---|
| WO | WO 2013/088948 A1 | 6/2013 |
| WO | WO 2014/190352 A1 | 11/2014 |
| WO | WO 2016/058037 A1 | 4/2016 |
| WO | WO 2017/044577 A1 | 3/2017 |
| WO | WO 2017/222796 A2 | 12/2017 |
| WO | WO 2018/089444 A1 | 5/2018 |
| WO | WO 2018/089450 A1 | 5/2018 |
| WO | WO 2018/156876 A1 | 8/2018 |
| WO | WO 2018/195152 A1 | 10/2018 |
| WO | WO 2018/195412 A1 | 10/2018 |
| WO | WO 2019/099461 A1 | 5/2019 |

OTHER PUBLICATIONS

Ait-Mansour et al., Ge epitaxial island growth on a graphitized C-rich 4H-SiC(0 0 0 1) surface. J Cryst Growth. Feb. 2005;275(1-2):e2275-80. Epub Jan. 7, 2005.

Alaskar et al., Theoretical and experimental study of highly textured GaAs on silicon using a graphene buffer layer. J Crystal Growth. Sep. 1, 2015;425:268-73. Epub Feb. 9, 2015.

Avouris et al., Graphene: synthesis and applications. Materials Today. Mar. 2012;15(3):86-97.

Balmer et al., Chemical vapour deposition synthetic diamond: Materials, technology and applications. J Phys Condens Matter. Aug. 2009;21(346):364221(1-3).

Barton et al., Transition metal dichalcogenide and hexagonal boron nitride heterostructures grown by molecular beam epitaxy. Microelectronic Engineering. 2015;147:306-9. doi: 10.1016/j.mee.2015.04.105. Epub May 5, 2015.

Bedell et al., Vertical light-emitting diode fabrication by controlled spalling. Appl Phys Exp. 2013;6(11):112301(1-4). Epub Oct. 18, 2013.

Bedell et al., Layer transfer by controlled spalling. J Phys D: Appl Phys. 2013;46(15):152002(1-6).

Bedell et al., Kerf-less removal of Si, Ge, and III-V layers by controlled spalling to enable low-cost PV technologies. IEEE J Photovolt. Apr. 2012;2(2):141-7.

Berger et al., Ultrathin epitaxial graphite: 2D electron gas properties and a route toward graphene-based nanoelectronics. J Phys Chem B. 2004;108(52):19912-6. Epub Dec. 3, 2004.

Cheng et al., Epitaxial lift-off process for gallium arsenide substrate reuse and flexible electronics. Nat Commun. 2013;4:1577(1-7). Epub Mar. 12, 2013.

Chung et al., Transferable GaN layers grown on ZnO-coated graphene layers for optoelectronic devices. Science. Oct. 29, 2010;330(6004):655-7. doi: 10.1126/science.1195403.

De Heer et al., Epitaxial graphene. Solid State Commun. 2007;143(1-2):92-100. Epub Apr. 27, 2007.

Diebold et al., Growth and characterization of GaAs on Sapphire (0001) by molecular beam epitaxy. Surf Interf Anal. Feb. 1990;15(2):150-8.

Distler, The real structure of crystals and selective nucleation at surface local long range active centres. J Cryst Growth. 1968;3:175-9.

Distler et al., Polarization structure of interfacial amorphous films. Nature. Jan. 4, 1969;221:52-3.

Distler et al., Oriented crystallization of AgCl on amorphous polyvinyl chloride replicas of NaCl single crystal surfaces. Thin Solid Films. 1970;6:203-11.

Emtsev et al., Towards wafer-size graphene layers by atmospheric pressure graphitization of silicon carbide. Nat Mater. Mar. 2009;8(3):203-7. doi: 10.1038/nmat2382. Epub Feb. 8, 2009.

Fan et al., Flexible Thin-Film InGaAs Photodiode Focal Plane Array. ACS Photonics. Mar. 16, 2016;3(4):670-6.

Freund et al., Thin film materials: Stress, defect formation and surface evolution. Cambridge Univ Press. 2009. 820 pages.

(56) References Cited

OTHER PUBLICATIONS

Greaving, Fabrication and characterization of diamond thin films as nanocarbon transistor substrates. Master's Thesis. Vanderbilt University. 48 pages. Aug. 2013.
Henning, Orientation of vacuum condensed overgrowths through amorphous layers. Nature. Sep. 12, 1970;227:1129-31.
Iida et al., Laser lift-off technique for freestanding GaN substrate using an In droplet formed by thermal decomposition of GaInN and its application to light-emitting diodes. Appl Phys Lett. 2014;105:072101(1-4). Epub Aug. 18, 2014.
Kayes et al., Flexible thin-film tandem solar cells with >30% efficiency. IEEE J Photovolt. Mar. 2014;4(2):729-33.
Kim et al., Engineering of contact resistance between transparent single-walled carbon nanotube films and a-Si:H single junction solar cells by gold nanodots. Adv Mater. Apr. 10, 2012;24(14):1899-902. doi: 10.1002/adma.201104677. Epub Mar. 5, 2012.
Kim et al., 9.4% efficient amorphous silicon solar cell on high aspect-ratio glass microcones. Adv Mater. Jun. 2014;26(24):4082-6. Epub Mar. 20, 2014.
Kim et al., High efficiency Cu2ZnSn(S,Se)4 solar cells by applying a double In2S3/CdS emitter. Adv Mater. Nov. 2014;26(44):7427-31. Epub Aug. 25, 2014.
Kim et al., Fabrication of dislocation-free tensile strained Si thin films using controllably oxidized porous Si substrates. Appl Phys Lett. 2006;89(15):152117(1-3). Epub Oct. 12, 2006.
Kim et al., A method for fabricating dislocation-free tensile-strained SiGe films via the oxidation of porous Si substrates. Appl Phys Lett. 2007;91(25):252108(1-3). Epub Dec. 19, 2007.
Kim et al., 10.5% efficient polymer and amorphous silicon hybrid tandem photovoltaic cell. Nat Commun. 2015;6:6391(1-6). doi: 10.1038/ncomms7391. 6 pages. Epub Mar. 4, 2015.
Kim et al., Layer-resolved graphene transfer via engineered strain layers. Science. Nov. 15, 2013;342(6160):833-6.
Kobayashi et al., Layered boron nitride as a release layer for mechanical transfer of GaN-based devices. Nature. Apr. 12, 2012;484:223-7.
Koma et al., Van der Waals epitaxy for highly lattice-mismatched systems. J Cryst Growth. 1999;201-202:236-41.
Koma et al., Fabrication and characterization of heterostructures with subnanometer thickness. Microelectron Eng. Oct. 1984;2(1-3):129-36.
Lee et al., Natural substrate lift-off technique for vertical light-emitting diodes. Appl Phys Exp. 2014;7(4):042103(1-4). Epub Mar. 14, 2014.
Lee et al., Reuse of GaAs substrates for epitaxial lift-off by employing protection layers. J Appl Phys. 2012;111(3):033527(1-6). Epub Feb. 15, 2012.
Lee et al., Wafer-scale growth of single-crystal monolayer graphene on reusable hydrogen-terminated germanium. Science. Apr. 18, 2014;344(6181):286-9.
Lin et al., Direct synthesis of van der Waals solids. ACS Nano. Apr. 22, 2014;8(4):3715-23. doi: 10.1021/nn5003858. Epub Mar. 18, 2014.
Loher et al., Van der Waals epitaxy of three-dimensional CdS on the two-dimensional layered substrate MoTe2(0001). Appl Phys Lett. Aug. 1, 1994;65(5):555-7.
Nakamura et al., GaN growth using GaN buffer layer. Jap J Appl Phys. Oct. 1991;30(10A):L1705-7.
Schlaf et al., Molecular beam epitaxy growth of thin films of SnS2 and SnSe2 on cleaved mica and the basal planes of single-crystal layered semiconductors: Reflection high-energy electron diffraction, low-energy electron diffraction, photoemission, and scanning tunneling microscopy/atomic force microscopy characterization. J Vac Sci Technol A. May/Jun. 1995;13(3):1761-7.
Shahrjerdi et al., Ultralight high-efficiency flexible InGaP/(In)GaAs tandem solar cells on plastic. Adv Energy Mater. May 2013;3(5):566-71.
Shahrjerdi et al., Extremely flexible nanoscale ultrathin body silicon integrated circuits on plastic. Nano Lett. 2013;13:315-20. Epub Dec. 18, 2012.
Suo et al., Steady-state cracking in brittle substrates beneath adherent films. Int J Solid Structures. 1989;25(11):1337-53.
Tanaka et al., Anisotropic layer-by-layer growth of graphene on vicinal SiC(0001) surfaces. Phys Rev B. Jan. 2010;81(4):041406R(1-4).
Thouless et al., The edge cracking and spalling of brittle plates. Acta Metall. 1987;35(6):1333-41.
Ueda et al., Separation of thin GaN from sapphire by laser lift-off technique. Jap J Appl Phys. 2011;50(4R):041001(1-6). Epub Apr. 20, 2011.
Ueno et al., Epitaxial growth of transition metal dichalcogenides on cleaved faces of mica. J Vac Sci Technol A. Jan./Feb. 1990;8(1):68-72.
Vishwanath et al., Controllable growth of layered selenide and telluride heterostructures and superlattices using molecular beam epitaxy. J Mater Res. Apr. 14, 2016;31(7):900-10.
Wang et al., Direct growth of graphene film on germanium substrate. Sci Rep. 2013;3:2465(1-6). doi: 10.1038/srep02465. Epub Aug. 19, 2013.
Yablonovitch et al., Extreme selectivity in the lift-off of epitaxial GaAs films. Appl Phys Lett. Dec. 28, 1987;51(26):2222-4.
Invitation to Pay Additional Fees dated May 3, 2018 for Application No. PCT/US2018/019393.
International Search Report and Written Opinion dated Jun. 26, 2018 for Application No. PCT/US2018/019393.
International Preliminary Report on Patentability dated Sep. 6, 2019 for Application No. PCT/US2018/019393.
PCT/US2018/019393, May 3, 2018, Invitation to Pay Additional Fees.
PCT/US2018/019393, Jun. 26, 2018, International Search Report and Written Opinion.
PCT/US2018/019393, Sep. 6, 2019, International Preliminary Report on Patentability.
Notice of Allowance dated Feb. 8, 2021 for U.S. Appl. No. 16/606,650.
Kong et al., Polarity governs atomic interaction through two-dimensional materials. Nat Mater. Nov. 2018;17:999-1005.

\* cited by examiner

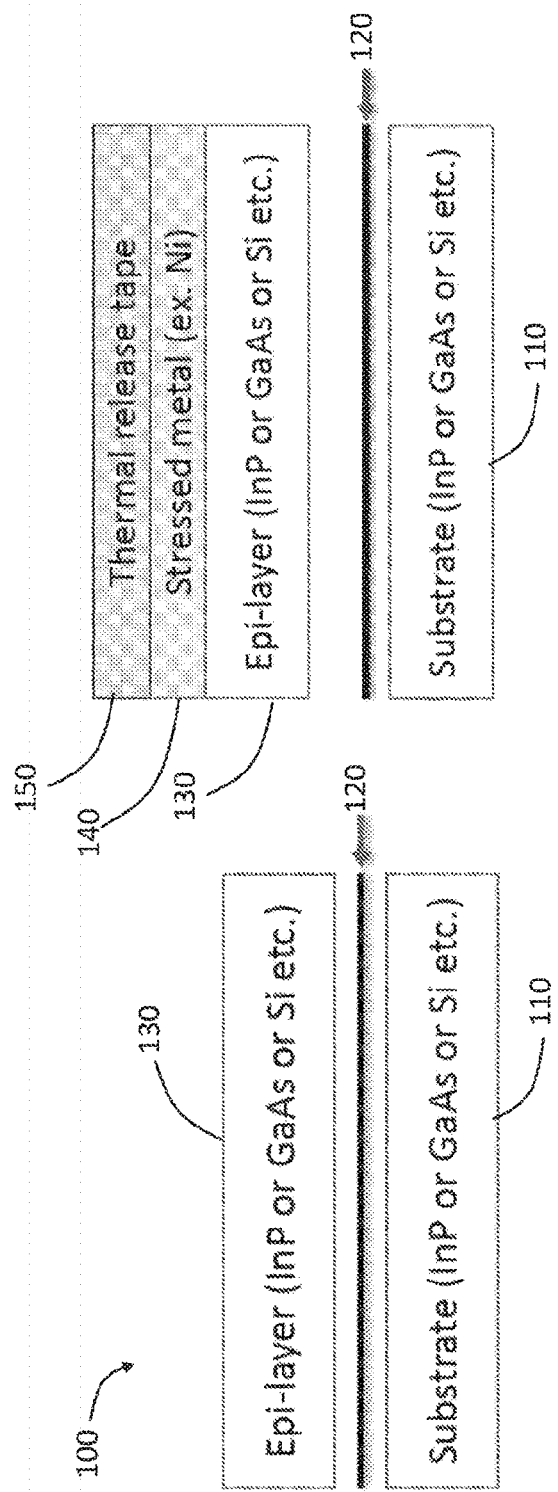

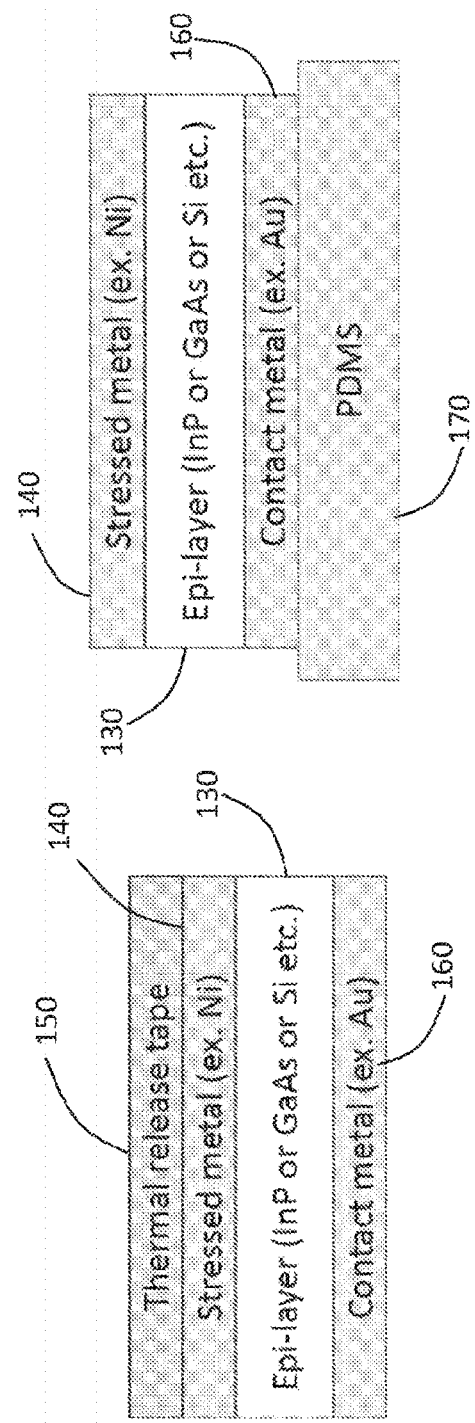

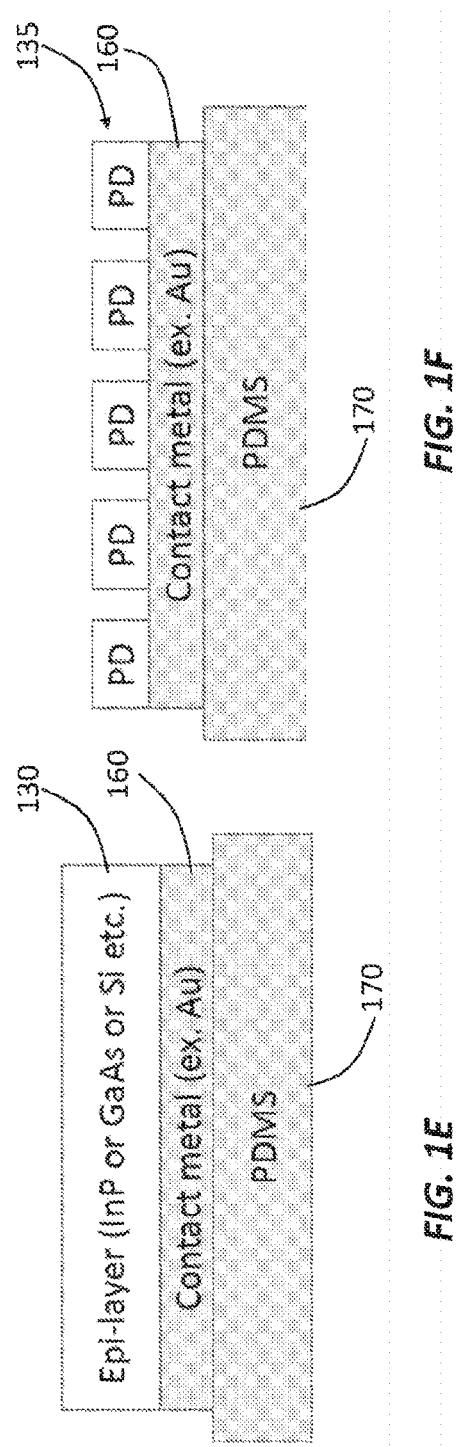

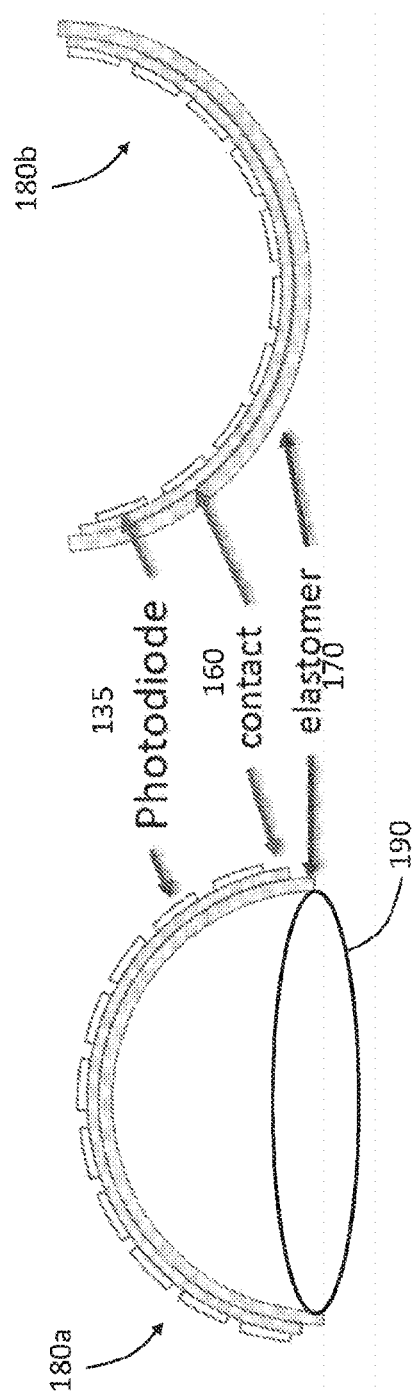

APPARATUS AND METHODS FOR CURVED FOCAL PLANE ARRAY

CROSS-REFERENCES TO RELATED APPLICATIONS

This application is a national stage application under 35 U.S.C. § 371 of International Patent Application Serial Number PCT/US2018/019393, filed Feb. 23, 2018, and entitled "APPARATUS AND METHODS FOR CURVED FOCAL PLANE ARRAY," which claims the priority benefit under 35 U.S.C. § 119(e) of U.S. Application No. 62/463,270, filed Feb. 24, 2017, and entitled "HEMISPHERICAL PHOTODETECTOR FOCAL PLANE ARRAY VIA GRAPHENE BASED LAYER TRANSFER," each of which is hereby incorporated herein by reference in its entirety.

BACKGROUND

A conventional detector array is usually in a planar configuration (i.e., it has a flat surface). Accordingly, the corresponding optical focal plane is also flat in order to match the shape of the detector array. This constraint can lead to off-axis aberrations including astigmatism, field curvature, and coma. To reduce these aberrations, additional optical elements, such as complex lens combinations, are often used, thereby complicating the resulting optical system and increasing the cost.

Alternatively, an optical system can use a curved focal plane array (FPA) to match the curvature of the focal plane produced by imaging optics (e.g., lenses). For example, in human eyes, the retina is a natural FPA that is curved to match the focal surface of the lens. Curved FPAs can simplify optical systems by reducing the number of optical elements, increasing reliability, and increasing the tolerance margins in optical design and manufacturing.

However, curved FPAs are usually manufactured with specialized processing, such as tiling, bending, or selective etching. For example, selective etching of a sacrificial layer can be employed to remove a fabricated photodiode layer from the growth substrate and dispose the photodiode layer on a cylinder to from a curved FPA. In addition, the radius of these curved FPAs are often very large (e.g., greater than 75 mm). As a result, applications of existing curved FPAs are currently limited to large, high-end optical systems such as astronomical telescopes.

SUMMARY

Embodiments of the present technology generally relate to curved focal plane arrays (FPAs). In one example, a method of fabricating a curved FPA includes forming an epitaxial layer comprising a semiconductor on a release layer comprising a two-dimensional (2D) material and disposed on a first substrate. The method also includes forming a metal layer on the epitaxial layer and transferring the epitaxial layer and the metal layer to a second substrate comprising an elastomer. The method also includes fabricating a plurality of photodetectors from the epitaxial layer and bending the second substrate to form the curved FPA.

In another example, a method of fabricating a curved FPA includes forming a plurality of cavities in a substrate and each cavity in the plurality of cavities has a corresponding curved inner surface. The method also includes conformally disposing a release layer on the curved inner surface of each cavity in the plurality of cavities and forming an epitaxial layer comprising a semiconductor in conformal contact with each release layer. The method also includes forming a handle layer on the epitaxial layer and releasing the epitaxial layer from the release layer using the handle layer. The method further includes bending the handle layer to form the curved FPA.

In yet another example, a method of fabricating a curved FPA includes forming a plurality of cavities in a substrate. Each cavity in the plurality of cavities has a corresponding curved inner surface and a diameter of about 10 µm to about 1 mm. The method also includes conformally disposing a graphene layer on the curved inner surface of each cavity in the plurality of cavities and forming an epitaxial layer comprising a p-n junction in conformal contact with each graphene layer. The method further includes forming a handle layer on the epitaxial layer and releasing the epitaxial layer from the release layer using the handle layer. The method also includes forming the handle layer into an arc with a radius of curvature substantially equal to or less than 10 cm so as to form the curved FPA.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A-1H illustrate a method of fabricating a curved focal plane array (FPA) using a layer transfer technique.

DETAILED DESCRIPTION

Overview

Figure 2A:
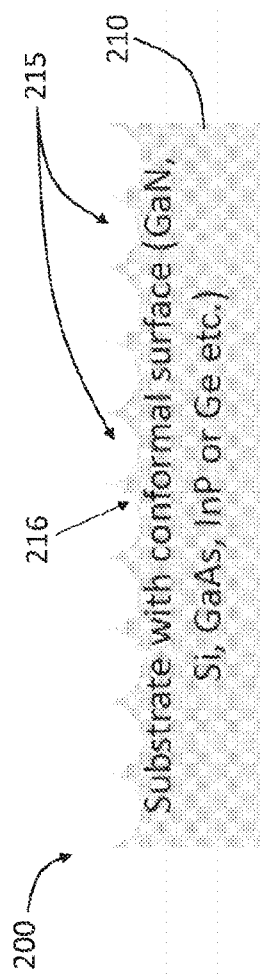
FIGS. 2A-2E illustrate a method of fabricating a curved FPA including an array of spherical detectors using a layer transfer technique.

Systems and methods described herein employ a layer transfer approach to fabricate curved focal plane arrays. In this approach, device layers (e.g., layers of a photodetector) are fabricated on a release layer made of a two-dimensional (2D) material, which in turn is disposed on a substrate that is lattice-matched to the semiconductor of the device layers. Without being bound by any particular theory or mode of operation, 2D materials refer to substances with a thickness of one or two atoms (e.g. a few nanometers or less). The fabricated device layers are then transferred from the lattice-matched substrate to a flexible host substrate, where further processing can be performed to form the curved focal plane array.

In this layer transfer approach, the release layer serves as a reusable platform for growing device layers and also allows fast, precise, and repeatable release at the interface between the release layer and the device layer. Compared to conventional methods, this layer transfer technique has several advantages. First, since most 2D materials can be fabricated as crystalline films (e.g., graphene), the release layer can be a suitable platform for growing epitaxial over-layers. Second, 2D materials usually interact weakly with other materials and therefore can substantially relax the lattice mismatching rule for epitaxial growth, potentially permitting the growth of most semiconducting films with low defect densities. Third, the device layers grown on the release layer can be easily and precisely released from the substrate owing to the weak van der Waals interactions between the release layer and the device layer.

Methods of Fabricating Curved FPAs Using Layer Transfer Technique

FIGS. 1A-1H illustrate a method 100 of fabricating curved focal plane arrays using layer transfer technique. In this method 100, a device layer 130 is fabricated on a release layer 120 that is disposed on a growth substrate 110, as illustrated in FIG. 1A. In one example, the device layer 130 includes a semiconductor material for photodetectors, such as silicon, germanium, InP, or GaAs, among others. In another example, the device layer 130 can include heterostructure for photon detection, such as $Al_xGa_{1-x}As/GaAs$ or $Hg_xCd_{1-x}Te/CdTe$, among others. In yet another example, the device layer 130 can include a Schottky structure, such as Au—ZnS or Au—Si, among others, that can be used to form a Schottky diode for photon detection. These structures in the device layer 130 can be fabricated via, for example, epitaxy growth, diffusion process, and/or implantation process.

The device layer 130 can be grown via gas source molecular beam epitaxy. For example, the device layer 130 can include an InGaAs p-i-n photodiode active layer grown on on a 2 in. (i.e. 50.8 mm) diameter, Zn-doped (100) InP wafer. The a Be-doped (e.g., 200 nm thick, $2 \times 10^{18}$ $cm^{-3}$) $p^+$-InP window layer can be grown, followed by an i-$In_{0.53}Ga_{0.47}As$ active absorption layer (e.g. 2.1 μm thick) and a Si-doped (e.g. 100 nm thick, $5 \times 10^{18}$ $cm^{-3}$) $n^+$-$In_{0.53}Ga_{0.47}As$ contact layer.

FIG. 1B shows that a stressor layer 140 is disposed on the device layer 130. For example, the stressor layer 140 can include a high-stress metal film, such as a Ni film. In this example, the Ni stressor can be deposited in an evaporator at a vacuum level of $1 \times 10^{-5}$ Torr. A tape layer 150 is disposed on the stressor layer 140 for handling the stressor layer 140 (together with the device layer 130). The device layer 130 can be mechanically exfoliated from the release layer 120 at a fast release rate by applying high strain energy to the interface between the device layer 130 and the release layer 120 using the tape layer 150 and the stressor layer 140. (Put differently, the device layer 130 can be peeled off the release layer 120 with the tape layer 150.) The release rate can be fast at least due to the weak van der Waals bonding between the 2D material in the release layer 120 and other materials in the device layer 130.

In FIG. 1C, the device layer 130 is exfoliated from the release layer 120 and transferred to an electrode layer 160. In one example, the device layer 130 can be disposed on a pre-formed electrode layer 160. In another example, the electrode layer 160 can be formed on the device layer 130 via, for example, sputtering, electroplating, thermal evaporation, and electron beam evaporation, among others. The tape layer 150 is then removed from the stressor layer 140 by, for example, mechanical peeling, as shown in FIG. 1D. FIG. 1D also shows that the combination of the electrode layer 160, the device layer 130, and the stressor 140 is disposed on a host substrate 170, which can include or be formed of a flexible material, such as polydimethylsiloxane (PDMS). In one example, the tape layer 150 can be used to dispose this combination on the host substrate 170. In another example, the combination can be held by a holder (not shown) and the host substrate 170 can be moved to be attached to the electrode layer 160.

In FIG. 1E, the stressor layer 140 is removed, leaving the device layer 130 for further processing. In some examples, the tape layer 150 and the stressor layer 140 can be etched away by a $FeCl_3$-based solution. In FIG. 1F, the device layer 130 is fabricated into an array of photodetectors 135 via, for example, wet etching or plasma etching. Each photodetector in the array of photodetectors 135 can function as a pixel in the resulting focal plane array.

In FIG. 1F, the device layer 130 can be photolithographically patterned using, for example, a LOR 3A (e.g. from MicroChem) and S1827 (e.g. from MicroChem) bilayer photoresist. A top ring contact can be deposited using e-beam evaporation and lifted off to define the light detection area. The top ring contact can include Ti (e.g. about 20 nm thick)/Pt (e.g. about 30 nm)/Au (e.g. about 200 nm) and the inner/outer diameter can be, for example, about 150 μm/170 μm. Photodiode mesas (e.g. 190 μm diameter, 314 μm pixel separation) can be patterned using inductively coupled plasma (ICP) reactive-ion etching (ME; e.g. $Cl_2$:$H_2$=16:12 sccm, 12 mTorr base pressure, 600 W ICP power, 100 W forward power, 0° C. stage temperature for 5 min). The back contact (e.g., 100 μm width) can be patterned using wet etching (e.g. 3 min in TFA Au etchant (Transene)) to connect the photodiode rows. Ohmic contacts can be formed by rapid thermal annealing (e.g. 1 min at 270° C.). A polyimide (e.g. PI2610, HD Microsystem) passivation layer (e.g. 1 μm thick) can be spin-cast and cured (e.g. at 300° C. for 30 min). The polyimide can be patterned to expose the photodiode detection area and back contact pads using, for example, ICP ME ($O_2$:$CF_4$=16:56 sccm, 5 mTorr base pressure, 500 W ICP power, 10 W forward power for 6 min). The e-beam-evaporated, 50 μm wide Ti (10 nm)/Au (300 nm) top contact can be patterned to connect columns of photodiodes. A antireflection coating can be deposited by e-beam evaporation to increase the quantum efficiency of the resulting photodiodes. The antireflection coating can include, for example, a bilayer structure of $MgF_2$ (e.g., about 37 nm) and $TiO_2$ (e.g. about 127 nm). More details about fabrication of photodetectors can be found in Dejiu Fan, Kyusang Lee, and Stephen R. Forrest, Flexible Thin-Film InGaAs Photodiode Focal Plane Array, ACS Photonics, 2016, 3 (4), pp 670-676, which is hereby incorporated herein by reference in its entirety.

Various types of photodetectors 135 can be fabricated by the method 100. In one example, the photodetectors 135 include photoconductors, which can include a semiconductor layer and two ohimic contacts to apply a bias voltage. In another example, the photodetectors 135 can include photodiodes, such as PN diodes or PIN diodes. In yet another example, the photodetectors 135 can include Schottky diodes. In yet another example, the photodetectors 135 can include avalanche photodiodes that are capable of operating in Geiger mode (i.e., photon counting mode) to resolve single photons.

The host substrate 170 is then deformed (e.g., by bending and/or stretching) into a curve. In one example, the host substrate 170 is bent outward with respect to the array of photodetectors 135 to form a first curved focal plane array 180*a*, as shown in FIG. 1G. In this instance, the array of photodetectors 135 is disposed on an outer surface of the curved host substrate 170 (like a compound eye). In another example, the host substrate 170 is bent inward with respect to the array of photodetectors 135 to form a second focal plane array 180*b*, as shown in FIG. 1H. In this instance, the array of photodetectors 135 is disposed on an inner surface of the curved host substrate 170 (like a retina).

In one example, the focal plane arrays 180*a* and 180*b* (collectively referred to as curved focal plane arrays 180) each have a hemispherical shape. In another example, the focal plane arrays 180 have a semi-cylindrical (e.g. $\pi$ imager) or cylindrical (e.g. $2\pi$ imager) shape. In yet another example, the focal plane array 180 can have any other appropriate shape depending on the optics (e.g., imaging lenses) used the imaging system. For example, each focal plane array 180 can be bent or curved to form part of a paraboloid, hyperboloid, or other solid of revolution; bent or warped along a spline, wavy, or corrugated shape; or in an almost arbitrary fashion.

An optional holder 190 can be used to maintain the focal plane arrays 180 in the curved shape. In one example, the holder 190 includes an aperture, such as a rigid ring as illustrated in FIG. 1G. For example, the focal plane arrays 180 can have a spherical shape and the rigid ring can be coupled to the edge of the host substrate 170 to maintain the spherical shape. Alternatively, the focal plane array 180 can have cylindrical shape and the rigid ring can according have a rectangular shape to fit the cross sectional shape of the focal plane arrays.

In another example, the holder 190 can include a supporting substrate having a contact surface to receive the focal plane arrays 180. For example, the holding mechanism can include a substrate having a spherical top surface to receive and hold spherical focal plane arrays. Alternatively, the holding mechanism can include a substrate having a cylindrical top surface to receive and hold cylindrical focal plane arrays.

Each photodetector in the array of photodetectors 135 can be much smaller than the host substrate 170. Therefore, the bending of the host substrate 170 does not affect the integrity of the photodetectors 135. For example, the array of photodetectors 135 can include more than 100 photodetectors (e.g., about 100, about 200, about 500, about 1000, about 2000, about 5000, about $10^4$, about $10^5$, about $10^6$, or greater, including any values and sub ranges in between). The size of each photodetector in the array of photodetectors 135 can be, for example, about 1 μm to about 50 μm (e.g., about 1 μm, about 2 μm, about 3 μm, about 5 μm, about 10 μm, about 20 μm, about 30 μm, about 40 μm, or about 50 μm, including any values and sub ranges in between).

Due to the flexibility of the host substrate 170, the resulting curved focal plane arrays 180*a* and 180*b* can be configured to have a wide range of curvatures so as to fit the focal planes of different imaging optics. For example, the curvature radius of the curved focal plane arrays 180*a* and 180*b* can be about 1 mm to about 100 mm (e.g., about 1 mm, about 2 mm, about 3 mm, about 5 mm, about 10 mm, about 20 mm, about 30 mm, about 50 mm, about 75 mm, or about 100 mm, including any values and sub ranges in between).

The growth substrate can include the same semiconductor material as used in the corresponding device layer 130. For example, the growth substrate 110 can include silicon InP, or GaAs, among others. This configuration allows lattice matching between the growth substrate 110 and the device layer 130. Therefore, the fabricated device layer 130 can have high crystalline quality (e.g., low density of defects, such as dislocations). Alternatively, the growth substrate 110 may use a different material from the material of the corresponding device layer 130, in which case the growth of the device layer 130 can be seeded by the release layers 120. More information about different seeding schemes can be found in PCT Application No. PCT/US2016/050701, filed Sep. 6, 2016, entitled "SYSTEMS AND METHODS FOR GRAPHENE BASED LAYER TRANSFER," which is hereby incorporated by reference in its entirety.

The release layer 120 includes a two-dimensional (2D) material to facilitate the transfer of the fabricated device layers 130 from the growth substrate 110 to the electrode layer 160 for further processing. Various types of 2D materials can be used for the release layer 120. In one example, the release layer 120 includes graphene (e.g., monolayer graphene or multilayer graphene). In another example, the release layer 120 includes transition metal dichalcogenide (TMD) monolayers, which are atomically thin semiconductors of the type $MX_2$, with M being a transition metal atom (e.g., Mo, W, etc.) and X being a chalcogen atom (e.g., S, Se, or Te). In a TMD lattice, one layer of M atoms is usually sandwiched between two layers of X atoms. In yet another example, the release layer 120 can include a single-atom layer of metal, such as palladium and rhodium.

Out of these 2D materials, graphene can have several desirable properties. For example, graphene is a crystalline film and is a suitable substrate for growing epitaxial overlayers. Second, graphene's weak interaction with other materials can substantially relax the lattice mismatching rule for epitaxial growth, potentially permitting the growth of most semiconducting films with low defect densities. Third, epilayers grown on a graphene substrate can be easily and precisely released from the substrate owing to graphene's weak van der Waals interactions, thereby allowing rapid mechanical release of epilayers without post-release reconditioning of the released surface. Fourth, graphene's mechanical robustness can increase or maximize its reusability for multiple growth/release cycles.

If the release layer 120 includes graphene, it may be referred to as a graphene layer 120. A graphene layer 120 can be grown directly on the growth substrate 110 or on a separate substrate (also referred to as a graphene growth substrate) and then transferred to the growth substrate 110.

The graphene layer 120 can be fabricated on the graphene growth substrate via various methods. In one example, the graphene layer 120 can include an epitaxial graphene with a single-crystalline orientation and the graphene growth substrate can include a (0001) 4H-SiC wafer with a silicon surface. The fabrication of the graphene layer 120 can include multiple annealing steps. A first annealing step can be performed in $H_2$ gas for surface etching and vicinalization, and a second annealing step can be performed in Ar for graphitization at high temperature (e.g., about 1,575° C.).

In another example, the graphene layer 120 can be grown on the graphene growth substrate via a chemical vapor deposition (CVD) process. The graphene growth substrate can include a nickel substrate or a copper substrate. Alternatively, the graphene growth substrate can include an insulating substrate of $SiO_2$, $HfO_2$, $Al_2O_3$, $Si_3N_4$, or practically any other high-temperature, planar material compatible with CVD.

In yet another example, the graphene growth substrate can be any substrate that can hold the graphene layer 120, and the fabrication can include a mechanical exfoliation process. In this example, the graphene growth substrate can function as a temporary holder for the graphene layer 120.

Various methods can also be used to transfer the graphene layer 120 from the graphene growth substrate to the growth substrate 110. In one example, a carrier film can be attached to the graphene layer 120. The carrier film can include a thick film of Poly(methyl methacrylate) (PMMA) or a thermal release tape and the attachment can be achieved via a spin-coating process. After the combination of the carrier film and the graphene layer 120 are disposed on the growth substrate 110, the carrier film can be dissolved (e.g., in acetone) for further fabrication of the device layer 130 on the graphene layer 120.

In another example, a stamp layer including an elastomeric material, such as polydimethylsiloxane (PDMS), can be attached to the graphene layer 120 and the graphene growth substrate can be etched away, leaving the combination of the stamp layer and the graphene layer 120. After the stamp layer and the graphene layer 120 are placed on the growth substrates 110, the stamp layer can be removed by mechanical detachment, producing a clean surface of the graphene layer 120 for further processing.

In yet another example, a self-release transfer method can be used to transfer the graphene layer 120 to the growth substrate 110. In this method, a self-release layer is first spin-cast over the graphene layer 120. An elastomeric stamp is then placed in conformal contact with the self-release layer. The graphene growth substrate can be etched away to leave the combination of the stamp layer, the self-release layer, and the graphene layer 120. After this combination is placed on the growth substrate 110, the stamp layer can be removed mechanically and the self-release layer can be dissolved under mild conditions in a suitable solvent. The release layer can include polystyrene (PS), poly(isobutylene) (PM), or Teflon AF (poly[4,5-difluoro-2,2-bis(trifluoromethyl)-1,3-dioxole-co-tetrafluoroethylene]).

In some examples, the release layer 120 can be porous. A porous release layer 120 can be fabricated by patterning a 2D material layer. For example, a porous film (e.g., oxide, nitride, or photoresist film) can be disposed on an intact 2D material layer. The porous film can have a high density of pinholes (e.g., about one pinhole per square micron). Dry etching using Ar plasma or $O_2$ plasma can be then carried out to open up the pinholes, thereby allowing ions in the etching plasma to propagate through the porous film and arrive at the 2D material layer. The etching plasma then etches the portion of the 2D material layer directly underneath the pinholes in the porous film and create a porous release layer. The porous film can then be removed, leaving the porous release layer for further processing (e.g., growth of the device layer 130). In one example, the porous film includes photoresist material and can be removed by acetone. In another example, the porous film includes oxide or nitride and can be removed by hydrogen fluoride (HF).

The fabrication of the device layer 130 can be carried out via epitaxial growth using appropriate semiconductor fabrication techniques known in the art. For example, low-pressure Metal-Organic Chemical Vapor Deposition (MOCVD) can be used to grow the device layer 130 including GaN on the release layer 120, which in turn is disposed on the growth substrate 110. In this example, the release layer 120 and the growth substrate 110 can be baked (e.g., under $H_2$ for >15 min at >1,100° C.) to clean the surface. Then the deposition of the device layer 130 including GaN can be performed at, for example, 200 mbar. Trimethylgallium, ammonia, and hydrogen can be used as the Ga source, nitrogen source, and carrier gas, respectively. A modified two-step growth can be employed to obtain flat GaN epitaxial films on the release layer 120. The first step can be carried out at a growth temperature of 1,100° C. for few minutes where guided nucleation at terrace edges can be promoted. The second growth step can be carried out at an elevated temperature of 1,250° C. to promote the lateral growth. Vertical GaN growth rate in this case can be around 20 nm per min.

In one example, the lattice of the growth substrate 110 is matched to the corresponding device layer 130, in which case the growth substrate 110 functions as the seed for the growth of the device layer 130. For example, the device layer 130 and the growth substrate 110 can include the same semiconductor material. In these instances, the release layer 120 can be porous or thin enough (e.g., a single layer of graphene). Sandwiching the release layer 120 between the growth substrate 110 and the device layer 130 can facilitate quick and damage-free release and transfer of the device layer 130.

In another example, the release layer 120 can be thick enough (e.g., several layers of graphene) to function as a seed to grow the device layer 130, in which case the device layer 130 can be latticed-matched to the release layer 120. In yet another example, the growth substrate 110 together with the release layer 120 can function as the seed to grow the device layer 130.

Using graphene in the release layer 120 as the seed to fabricate the device layers 130 can also increase the tolerance to mismatch between the lattice constants of the photodetector material and graphene. Without being bound by any particular theory or mode of operation, surfaces of two-dimensional (2D) materials (e.g., graphene) or quasi-2D layered crystals typically have no dangling bonds and interact with material above them via weak van der Waals like forces. Due to the weak interaction, an epilayer can grow from the beginning with its own lattice constant to form an interface with a small number of defects. This kind of growth can be referred to as Van Der Waals Epitaxy (VDWE). The lattice matching condition can be drastically relaxed for VDWE, allowing a large variety of different heterostructures even for highly lattice mismatched systems. In practice, the lattice mismatch can be about 0% to about 70% (e.g., about 0%, about 10%, about 20%, about 30%, about 40%, about 50%, about 60%, and about 70%, including any values and sub ranges in between).

Methods of Fabricating Curved FPAs Including Curved Pixels

FIGS. 2A-2E illustrate a method 200 of fabricating a curved FPA including an array of spherical detectors using layer transfer technique. In the method 200, cavities 215 are formed in a substrate 210 as illustrated in FIG. 2A. The substrate 210 can include a semiconductor, such as silicon, germanium, GaAs, GaN, or InP. The cavities 215 can be formed via, for example, isotropic wet etching. In one example, the cavities 215 form a periodic array, such as a one-dimensional (1D) array or a two-dimensional (2D) array. The pitch of the array can be, for example, about 10 μm to about 1 mm (e.g., about 10 μm, about 20 μm, about 30 μm, about 50 μm, about 100 μm, about 200 μm, about 300 μm, about 500 μm, or about 1 mm, including any values and sub ranges in between). In another example, the cavities 215 can be randomly distributed on the substrate 210

Each cavity 215 has a curved inner surface 216. In one example, the curved inner surface 216 is substantially semicylindricl or hemispherical. In another example, the curved inner surface 216 is substantially paraboloidal. In yet another example, the curved inner surface 216 is substantially hyperboloidal. Any other appropriate shape can also be used. The diameter of each cavity 215 can be about 10 μm to about 1 mm (e.g., about 10 μm, about 20 μm, about 30 μm, about 50 μm, about 100 μm, about 200 μm, about 300 μm, about 500 μm, or about 1 mm, including any values and sub ranges in between).

Figure 2B:
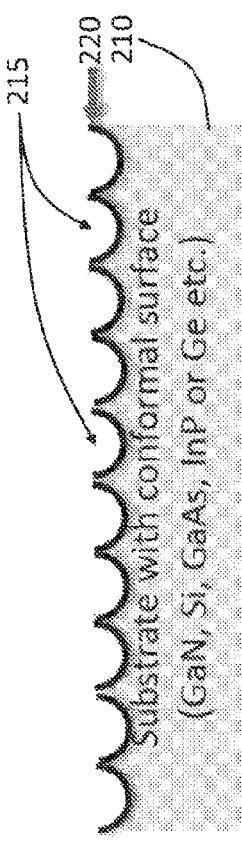

In FIG. 2B, a release layer 220 is conformally disposed on the inner surface 216 of each cavity 215. The release layer 220 can include a 2D material (e.g., graphene or any other 2D material described herein) to facilitate the layer transfer in subsequent steps (e.g., illustrated in FIG. 2D). In one example, the release layer 220 includes a single-piece layer conformally disposed on the inner surfaces of the cavities 215. In another example, a separate release layer 220 is disposed on the inner surface 216 of each cavity 215 (as shown in FIG. 2B).

In one example, the release layer 220 can be directly grown on the inner surfaces 216 of the cavities 215 via, for example chemical vapor deposition (CVD) technique. In another example, the release layer 220 can be grown on another substrate and then transferred onto the inner surface 216 of the cavities 215 using the layer transfer techniques described above. External pressure can be used to conformally fit the release layer 220 onto the curved inner surface 216 of each cavity 215.

Figure 2C:
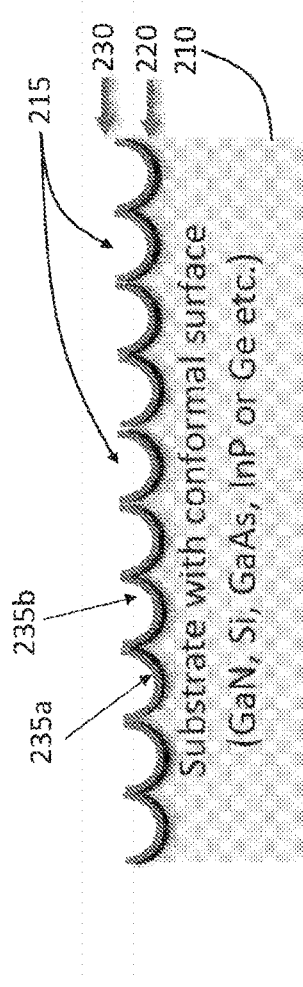

FIG. 2C shows that an epitaxial layer 230 (also referred to as a device layer 230) is formed on the release layer 220. The epitaxial layer 230 includes a semiconductor and is conformally disposed on the release layer 220. Accordingly, the shape of the epitaxial layer 230 can be substantially identical to the shape of the curved inner surface 216.

The epitaxial layer 230 can include a multilayer structure to detect photons or perform other functions. For example, the epitaxial layer 230 can include a p-doped layer, an n-doped layer, and a p-n junction formed in between. In another example, the epitaxial layer 230 can include a heterostructure, such as $Al_xGa_{1-x}As/GaAs$ or $Hg_xCd_{1-x}Te/CdTe$. In addition, conductive contacts (not shown in FIG. 2B) can also be formed on the epitaxial layer 230 to electrically couple the epitaxial layer 230 to external circuit, such as a power supply or a controller.

As illustrated in FIG. 2C, the epitaxial layer 230 includes multiple individual layers 235a/b (only two are labelled) such that each cavity 215 has a corresponding epitaxial layer 235a/b disposed on its inner surface 216. These individual layers 235a and 235b can be electrically insulated from each other so as to allow independent control of each individual layer 235a/b (e.g., photodetector). In one example, a single-piece epitaxial layer is formed conformally on the inner surfaces 216 of all cavities 215 and then patterned into multiple epitaxial layers 230a/b, each of which is disposed on a corresponding inner surface 216 of a cavity 215. In another example, each epitaxial layer 230a/b can be formed individually.

Figure 2D:
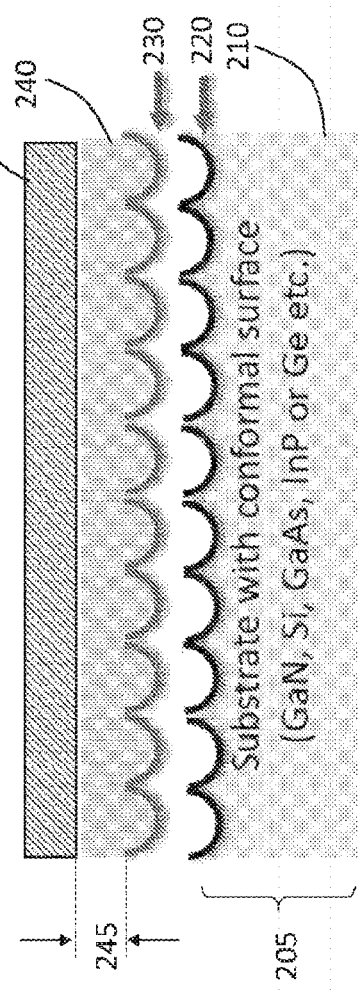

In FIG. 2D, a handle layer 240 is formed on the epitaxial layer 230 and employed to release the epitaxial layer 230 from the release layer 220. The handle layer 240 can be formed by filling the cavities 215 with metal or polymer and forming an additional thickness 245 above the cavities 215. The thickness 245 of the handle layer 240 can be, for example, about 1 μm to about 100 μm (e.g., about 1 μm, about 2 μm, about 3 μm, about 5 μm, about 10 μm, about 20 μm, about 30 μm, about 50 μm, or about 100 μm, including any values and sub ranges in between).

An optional release tape layer 242 can be formed on the handle layer 240 to facilitate the layer transfer. In this instance, the handle layer 240 can be substantially similar to the stressor layer 140 and the release tape layer 242 can be substantially similar to the tape layer 150 shown in FIG. 1C. After the release of the epitaxial layer 230 from the release layer 220, the tape layer 242 can be removed by, for example, mechanical peeling or etching (e.g., using a $FeCl_3$-based solution). In addition, the platform 205, including the combination of the substrate 210 and the release layer 220, can be used for next cycle of fabricating a new epitaxial layer, thereby allowing multiple use of the platform 205.

Figure 2E:
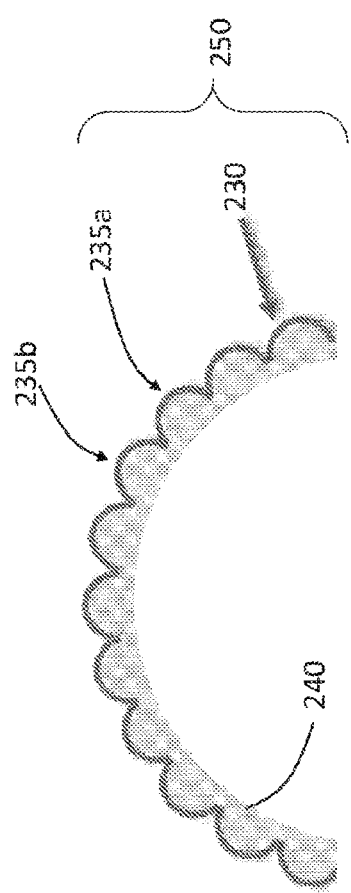

FIG. 2E shows that the handle layer 240 is curved, bent, warped, or otherwise formed into an arc so as to form a curved FPA 250. The curvature radius of the curved FPA 250 can be about 1 mm to about 100 mm (e.g., about 1 mm, about 2 mm, about 3 mm, about 5 mm, about 10 mm, about 20 mm, about 30 mm, about 50 mm, about 75 mm, or about 100 mm, including any values and sub ranges in between).

In the curved FPA 250, each individual epitaxial layer 235a/b can function as a pixel. The curved surface of each epitaxial layer 235a/b can realize wide acceptance angle without using micro-lens arrays. In addition, the curvature of the handle layer 240, which can function as a host substrate for the array of pixels, can fit the focal plane of imaging optics used in the imaging system. In one example, the curved FPA 250 has a partially spherical (e.g., hemispherical) shape. In another example, the curved FPA 250 has a partially cylindrical (e.g., semicylindrical) shape. In yet another example, the curved FPA 250 can have any other appropriate shape depending on the optics (e.g., imaging lenses) used the imaging system.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of fabricating a curved focal plane array (FPA), the method comprising:
    forming an epitaxial layer comprising a semiconductor on a release layer comprising a two-dimensional (2D) material disposed on a first substrate;
    forming a metal layer on the epitaxial layer;
    transferring the epitaxial layer and the metal layer to a second substrate comprising an elastomer;
    fabricating a plurality of photodetectors from the epitaxial layer; and
    bending the second substrate to form the curved FPA, wherein the 2D material has a thickness of one or two atoms.

2. The method of claim 1, wherein the semiconductor comprises at least one of silicon, InP, or GaAs.

3. The method of claim 1, wherein the first substrate comprises the semiconductor.

4. The method of claim 1, wherein the 2D material comprises graphene.

5. The method of claim 1, wherein forming the epitaxial layer comprises forming a p-n junction in the epitaxial layer.

6. The method of claim 1, wherein forming the epitaxial layer comprises forming a heterostructure in the epitaxial layer.

7. The method of claim 1, further comprising:
    forming the release layer on a third substrate; and
    transferring the release layer from the third substrate to the first substrate.

8. The method of claim 7, wherein the third substrate comprises silicon carbide and the 2D material comprises single-crystalline graphene.

9. The method of claim 7, wherein the third substrate comprises copper and the 2D material comprises polycrystalline graphene.

10. The method of claim 1, wherein transferring the epitaxial layer comprises:
    forming a metal stressor on the epitaxial layer;
    disposing a flexible tape on the metal stressor; and
    pulling the epitaxial layer and the metal stressor off the release layer with the flexible tape.

11. The method of claim 1, wherein bending the second substrate comprises forming the second substrate into an arc with a radius of curvature substantially equal to or less than 10 cm.

12. The method of claim 1, further comprising:
    after transferring the epitaxial layer and the metal layer to the second substrate, forming another epitaxial layer on the release layer.

13. A method of fabricating a curved focal plane array (FPA), the method comprising:
    forming an epitaxial layer comprising a semiconductor on a release layer comprising a two-dimensional (2D) material disposed on a first substrate;

forming a metal layer on the epitaxial layer;
transferring the epitaxial layer and the metal layer to a second substrate comprising an elastomer;
fabricating a plurality of photodetectors from the epitaxial layer; and
bending the second substrate to form the curved FPA,
wherein the 2D material is bound to the epitaxial layer via van der Waals forces.

14. The method of claim 13, wherein the semiconductor comprises at least one of silicon, InP, or GaAs.

15. The method of claim 13, wherein the first substrate comprises the semiconductor.

16. The method of claim 13, wherein the 2D material comprises graphene.

17. The method of claim 13, wherein forming the epitaxial layer comprises forming a p-n junction in the epitaxial layer.

18. The method of claim 13, wherein forming the epitaxial layer comprises forming a heterostructure in the epitaxial layer.

19. The method of claim 13, further comprising:
forming the release layer on a third substrate; and
transferring the release layer from the third substrate to the first substrate.

20. The method of claim 19, wherein the third substrate comprises silicon carbide and the 2D material comprises single-crystalline graphene.

21. The method of claim 19, wherein the third substrate comprises copper and the 2D material comprises polycrystalline graphene.

22. The method of claim 13, wherein transferring the epitaxial layer comprises:
forming a metal stressor on the epitaxial layer;
disposing a flexible tape on the metal stressor; and
pulling the epitaxial layer and the metal stressor off the release layer with the flexible tape.

23. The method of claim 13, wherein bending the second substrate comprises forming the second substrate into an arc with a radius of curvature substantially equal to or less than 10 cm.

24. The method of claim 13, further comprising:
after transferring the epitaxial layer and the metal layer to the second substrate, forming another epitaxial layer on the release layer.

* * * * *